(12) United States Patent
Park et al.

(10) Patent No.: US 7,943,519 B2
(45) Date of Patent: May 17, 2011

(54) ETCHANT, METHOD FOR FABRICATING INTERCONNECTION LINE USING THE ETCHANT, AND METHOD FOR FABRICATING THIN FILM TRANSISTOR SUBSTRATE USING THE ETCHANT

(75) Inventors: Hong-sick Park, Suwon-si (KR); Shi-yul Kim, Yongin-si (KR); Jong-hyun Choung, Suwon-si (KR); Won-suk Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 325 days.

(21) Appl. No.: 11/473,607

(22) Filed: Jun. 22, 2006

(65) Prior Publication Data
US 2006/0292888 A1 Dec. 28, 2006

(30) Foreign Application Priority Data

Jun. 22, 2005 (KR) .................. 10-2005-0054015

(51) Int. Cl.
*H01L 21/302* (2006.01)
*H01L 21/461* (2006.01)
(52) U.S. Cl. ............... 438/689; 438/694; 257/E21.009; 257/E21.022; 257/E21.025; 257/E21.151; 257/E21.162; 257/E21.291; 257/E21.413; 257/E21.414
(58) Field of Classification Search .................. 438/149, 438/694, 689; 257/E21.009, 22, 25, 151, 257/162, 251, 291, 413, 414
See application file for complete search history.

(56) References Cited

U.S. PATENT DOCUMENTS

| 6,376,861 | B1 * | 4/2002 | Yaegashi et al. | 257/59 |
| 6,585,568 | B2 * | 7/2003 | Tsuchiya et al. | 451/36 |
| 6,773,476 | B2 * | 8/2004 | Sakai et al. | 51/307 |
| 2004/0118814 | A1 * | 6/2004 | Kim et al. | 216/96 |
| 2005/0274947 | A1 * | 12/2005 | Chen et al. | 257/59 |
| 2006/0267014 | A1 * | 11/2006 | Park et al. | 257/59 |
| 2006/0276108 | A1 * | 12/2006 | Benson | 451/41 |

FOREIGN PATENT DOCUMENTS

| CN | 1510169 | 7/2004 |
| CN | 1576395 | 2/2005 |
| JP | 6-116756 | 4/1994 |
| JP | 6-179984 | 6/1994 |
| JP | 2002-231666 | 8/2002 |
| KR | 2003-0084397 | 11/2003 |

OTHER PUBLICATIONS

Patent Abstracts of Japan, Publication No. 06-116756, Apr. 26, 1994, 1 p.
Patent Abstracts of Japan, Publication No. 06-179984, Jun. 28, 1994, 1 p.
Patent Abstracts of Japan, Publication No. 2002-231666, Aug. 16, 2002, 1 p.
Korean Patent Abstracts, Publication No. 1020030084397, Nov. 1, 2003, 1 p.

* cited by examiner

*Primary Examiner* — Thao X Le
*Assistant Examiner* — Eric W Jones
(74) *Attorney, Agent, or Firm* — Innovation Counsel LLP

(57) ABSTRACT

An etchant, a method for fabricating a multi-layered interconnection line using the etchant, and a method for fabricating a thin film transistor (TFT) substrate using the etchant. The etchant for the multi-layered line comprised of molybdenum/copper/molybdenum nitride illustratively includes 10-20 wt % hydrogen peroxide, 1-5 wt % organic acid, a 0.1-1 wt % triazole-based compound, a 0.01-0.5 wt % fluoride compound, and deionized water as the remainder.

14 Claims, 19 Drawing Sheets

ETCHANT, METHOD FOR FABRICATING INTERCONNECTION LINE USING THE ETCHANT, AND METHOD FOR FABRICATING THIN FILM TRANSISTOR SUBSTRATE USING THE ETCHANT

This application claims priority from Korean Patent Application No. 10-2005-0054015 filed on Jun. 22, 2005, in the Korean Intellectual Property Office, the disclosure of which is incorporated herein by reference in its entirety.

BACKGROUND OF THE INVENTION

1. Field of the Invention

The present invention relates to an etchant, and more particularly, to an etchant for a multi-layered interconnection line consisting of molybdenum/copper/molybdenum nitride, a method for fabricating a molybdenum/copper/molybdenum nitride multi-layered interconnection line using the etchant, and a method for fabricating a thin film transistor (TFT) substrate using the etchant.

2. Description of the Related Art

A liquid crystal display ("LCD"), which is one of the most widely used flat panel displays, includes two substrates having a plurality of electrodes and a liquid crystal layer interposed therebetween. The voltages to the electrodes rearrange the liquid crystal molecules, thereby adjusting the transmitted amount of incident light. Specifically, a plurality of pixel electrodes are arranged in matrix form on one of the two substrates and a common electrode covers the entire surface of the other substrate. An image is displayed on the LCD by applying individual voltages to the respective pixel electrodes. On the substrate, a plurality of three-terminal TFTs are connected to the respective pixel electrodes through a plurality of gate lines and data lines that transmit signals to control the TFTs.

As the display area of the LCD increases, the gate lines and the data lines connected to the TFTs also grow longer, causing an increase in the resistance of the connection lines. To solve the signal delay problem resulting from the increase in the resistance, the gate lines and the data lines should be formed of a material having as low a resistivity as possible. Copper (Cu) is among the low resistivity materials that might be used in the interconnection lines of an LCD. However, copper has poor adhesion to the substrate which is made of an insulating material formed of a glass and semiconductors made of intrinsic amorphous silicon or doped amorphous silicon. Cu has poor chemical resistance to chemical substances, is easily oxidized or corroded when exposed to the etchants that are employed to pattern the Cu layer and may easily be over-etched or etched non-uniformly and may lift or peeling away from the substrate, thereby degrading the interconnection line's lateral profile. In addition, since Cu exposed to the etchant is oxidized or corroded, resistivity increases and reliability of the interconnection line is degraded. Consequently, there is a need for an etchant that improves the lateral profile of the interconnection line and maintains the adhesion of the Cu layer to the substrate during the process of patterning the Cu layer deposited on the substrate.

SUMMARY OF THE INVENTION

The present invention provides an etchant and a method for fabricating an LCD having a substrate bearing thin film transistors and low resistivity interconnection lines, especially lines made of multi-layers molybdenum/copper/molybdenum nitride (MoN). The above stated objects as well as other objects, features and advantages, of the present invention will become clear to those skilled in the art upon review of the following description.

According to an aspect of the present invention, there is provided an etchant for (Mo)/(Cu)/(MoN) multi-layered interconnection line. An exemplary formulation etchant includes 10-20 wt % hydrogen peroxide, 1-5 wt % organic acid, a 0.1-1 wt % triazole-based compound, a 0.01-0.5 wt % fluoride compound, and deionized water as the remainder.

According to another aspect of the present invention, there is provided a method for fabricating a thin film transistor (TFT) substrate, the method including forming a multi-layered gate line on a substrate and forming a gate interconnection line by etching the multi-layered gate line, forming a gate insulating layer and a semiconductor layer on the substrate and the gate interconnection line, forming a multi-layered data line on the semiconductor layer and forming a data interconnection line by etching the multiple-layered data line, wherein the forming of the gate interconnection line and/or the data interconnection line comprises sequentially depositing a molybdenum layer, a copper layer, and a molybdenum nitride layer on the substrate and etching using an etchant including 10-20 wt % hydrogen peroxide, 1-5 wt % organic acid, a 0.1-1 wt % triazole-based compound, a 0.01-0.5 wt % fluoride compound, and deionized water as the remainder.

BRIEF DESCRIPTION OF THE DRAWINGS

The above and other features and advantages of the present invention will become more apparent by describing in detail preferred embodiments thereof with reference to the attached drawings in which:

FIGS. 13B through 18 are cross-sectional views taken along the line B-B' of FIG. 13A, illustrating processing steps.

DETAILED DESCRIPTION OF THE INVENTION

Figure 1:
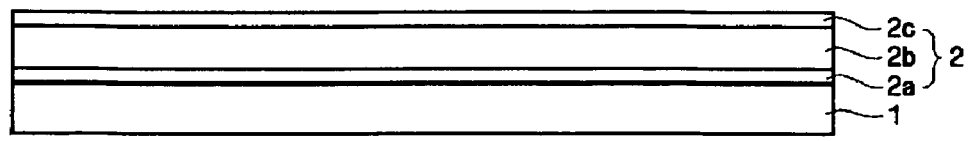
FIGS. 1 through 3 are cross-sectional views illustrating processing steps of a method for fabricating a metal interconnection line according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Figure 2:
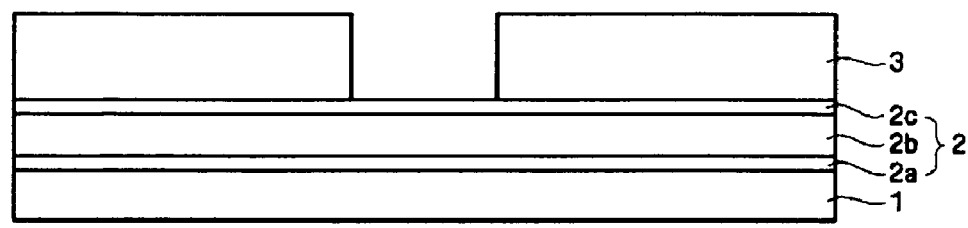
Figure 3:
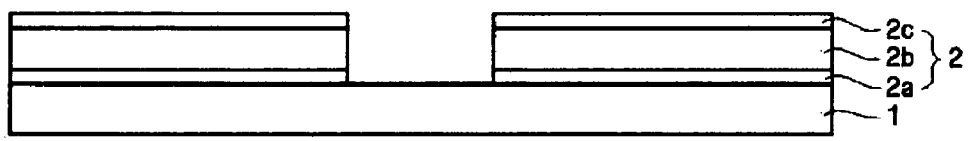

FIGS. 1 through 3 are cross-sectional views illustrating processing steps of a method for fabricating a metal interconnection line according to an embodiment of the present invention. Referring to FIG. 1, the connection line 2 comprises three layers sequentially deposited on substrate 1: a conductive layer 2a (hereinafter, referred to as a molybdenum layer) formed of Mo or a Mo alloy, tungsten (W), neodymium (Nd), and niobium (Nb); a conductive layer 2b (hereinafter, referred to as a Cu layer) which includes Cu or a Cu alloy: and a conductive layer 2c (hereinafter, referred to as a molybdenum nitride (MoN) layer) including MoN. Substrate 1 may be made, for example, of an insulating glass or a semiconductor made of intrinsic amorphous silicon, or doped amorphous silicon.

The Mo layer 2a, the Cu layer 2b, and the MoN layer 2c are formed by, for example, a sputtering method. Hereinafter, the sputtering method will be described in detail. First, the Mo layer 2a is formed on the substrate 1 by applying power only to a Mo target, not to a Cu target. The Mo layer 2a is formed to a thickness of about 50-500 Å. When the thickness of the Mo layer 2a is greater than 50 Å, sufficient adhesion can be provided between the substrate 1 and the conductive Cu layer 2b by effectively preventing the substrate 1 and the Cu layer 2b from partially contacting each other. It is preferable that the thickness of the Mo layer 2a be less than 500 Å to achieve a desirable contact resistance. More preferably, the Mo layer 2a is formed to a thickness of 100-300 Å. The Mo layer 2a prevents peeling or lifting of the triple-layered interconnection line 2 by improving adhesion to the substrate 1 and prevents Cu from being oxidized and diffusing into the substrate 1.

After the power applied to the Mo target is turned off, the power is applied to the Cu target, thereby forming the Cu layer 2b. The Cu layer 2b is formed to a thickness of about 1000-3000 Å, preferably 1500-2500 Å.

After the power applied to the Cu target is turned off, the power is applied to the Mo target again. Then, a nitrogen supply gas such as nitrogen gas (N2), ammonia (NH3), or nitrous oxide (N2O) is supplied, and Mo and N interact with each other and form the MoN layer 2c. The nitrogen supply gas can be separately provided, but preferably, an argon (Ar) gas and the nitrogen supply gas are mixed in a ratio of 40:60 and the mixture is provided.

The MoN layer 2c is formed to a thickness of about 50-2000 Å. When the MoN layer 2c is formed to a thickness of 50 Å or more, it can properly function as a passivation layer. It is preferable that the MoN layer 2c is formed to a thickness of 2000 Å or less to achieve a desirable contact resistance, more preferably, about 100-500 Å. The MoN layer 2c formed on the Cu layer 2b serves as a passivation layer for protecting the Cu layer 2b and prevents Cu of the Cu layer 2b from being oxidized or contaminated by other organic materials during the fabrication process. The MoN layer 2c also prevents Cu from diffusing from the Cu layer 2b.

Inherent nitric properties of MoN prevent Cu from being oxidized in a contact area between MnO and Cu, thereby preventing the resistance of the triple-layered interconnection line 2 from rapidly increasing.

Next, as shown in FIG. 2, a photoresist film is coated on the triple-layered interconnection line 2 and is then exposed and developed, thereby forming a photoresist film pattern 3 that defines an interconnection line pattern. As shown in FIG. 3, the triple-layered interconnection line 2 is etched using the photoresist film pattern 3 as an etching mask and the photoresist film pattern 3 is then removed, thereby forming the triple-layered interconnection 2. The etching with respect to the triple-layered interconnection line 2 may be wet etching using an etchant. The etchant, according to an embodiment of the present invention includes hydrogen peroxide, organic acid, a triazole-based compound, a fluoride compound, and deionized water as the remainder. Hydrogen peroxide is associated with an etching speed. When the amount of hydrogen peroxide is greater than 10 wt %, a sufficiently high etching speed can be provided. When the amount of hydrogen peroxide is less than 20 wt %, the etching speed can be easily controlled.

Organic acid helps to control pH of the etchant within a range of about 0.5-4.5, thereby providing an environment in which the Cu layer, the Mo layer, and the MoN layer can be etched simultaneously. Acetic acid, butanoic acid, citric acid, formic acid, gluconic acid, glycolic acid, malonic acid, oxalic acid, or pentanoic acid may be used as organic acid. Preferably, citric acid may be used as organic acid. However, organic acid is not limited to these examples and other water-soluble organic acids may be used. The appropriate amount of organic acid for controlling the pH of the etchant is in a range of, but not limited to, 1.0-5 wt %, and may vary with the pH of an added material.

The triazole-based compound suppresses undercut and is associated with etching speed. As the triazole-based compound, 1,2,3-triazole, 1,2,4-triazole, 5-penyl-1,2,4-triazole, 5-1,2,4-triazole, benzotriazole, 1-methyl-benzotriazole, or tolyltriazole may be used. Preferably, benzotriazole is used as the triazole-based compound. When the amount of the triazole-based compound is greater than 0.1 wt %, undercut can be efficiently suppressed. When the amount of the triazole-based compound is less than 1 wt %, a sufficiently high etching speed can be maintained. The fluoride compound accelerates etching of the MoN layer.

Hydrofluoric acid, ammonium fluoride, sodium fluoride, or potassium fluoride may be used as the fluoride compound. Preferably, hydrofluoric acid may be used as the fluoride compound. When the amount of the fluoride compound is greater than 0.01 wt %, the Mo layer is sufficiently etched. When the amount of the fluoride compound is less than 0.5 wt %, over-etching of the substrate or the semiconductor layer can be prevented. Moreover, in order to improve the characteristic of the etchant, an additive such as a surfactant may further be included in the etchant. The surfactant may be an anionic surfactant, a cationic surfactant, or a nonionic surfactant. The amount of the surfactant contained in the etchant may be in a range of 0.001-1 wt %, preferably 0.005-0.1 wt %. The etchant may include deionized water as the remainder except for the above referenced materials. The pH of the etchant may be in a range of about 0.5-4.5.

To prepare the etchant, hydrogen peroxide, organic acid, a triazole-based compound, and a fluoride compound are mixed into water such as deionized water, or solutions of those substances are previously made and are then mixed. However, there is no specific limit in an etchant fabricating method and a mixing order. The etchant has high etching selectivity with respect to the triple-layered interconnection line 2, maintains adhesion of the triple-layered interconnection line 2 to the substrate 1 after the etching process, and allows the triple-layered interconnection line 2 to have a good tapered lateral profile which is at an acute angle to the substrate 1.

Hereinafter, a process of etching the triple-layered interconnection line 2 using the etchant according to an embodiment of the present invention will be described in detail. Etching of the triple-layered interconnection line 2 may be independently performed on each of the MoN layer 2c, the Cu layer 2b, and the Mo layer 2a. However, the MoN layer 2c, the Cu layer 2b, and the Mo layer 2a may be etched in a batch manner, leading to a good lateral profile of the triple-layered interconnection line 2. Etching may be performed by spraying the etchant onto the surface of the triple-layered interconnection line 2 on which the photoresist film pattern 3 is formed. The etching temperature may be maintained at about 20-50° C. Etching time may be determined by considering the exposure time. Using an end point detector (EPD), the etching time may be 1.5 times the exposure time. For example, the etching time may be about 50-120 seconds.

A profile of a metal interconnection line according to an embodiment of the present invention using the etchant will be described with reference to FIG. 4 which pictures a cross-sectional profile of a triple-layered interconnection line including a Mo layer, a Cu layer, and a MoN layer formed on a substrate which was patterned using the etchant according to an embodiment of the present invention. In general, the Cu layer 2b included in the triple-layered interconnection line 2 has poor adhesion to the substrate 1. To improve adhesion with respect to the substrate 1, in the illustrative embodiment of the present invention, the Mo layer 2a is formed between the substrate 1 and the Cu layer 2b as a buffer layer, thereby improving adhesion to the substrate 1 and preventing peeling or lifting of the interconnection line. In the illustrative embodiment, the MoN layer 2c is deposited on the Cu layer 2b, thereby preventing oxidation and corrosion of the Cu layer 2b.

It should be appreciated that use of a conventional etchant for patterning triple-layered interconnection line 2 may result in the line being over-etched thus critically skewing a dimension, degrading the linearity of the triple-layered interconnection line 2 and degrading reliability due to breakage. Moreover, if the Mo layer under the Cu layer is over-etched, the Cu layer may be lifted and peel from the substrate. When the etching rate of Mo is low, the Mo layer under the Cu layer may be improperly etched and some of the Mo layer may remain. The remaining Mo layer may cause electrical shorts or degrade electrical characteristics. Moreover, when the etching speed with respect to each of the Mo layer, the Cu layer, and the MoN layer is not controlled, the lateral profile of the triple-layered interconnection line 2 may not be uniform and may have an inversely tapered tilt angle.

Figure 4:
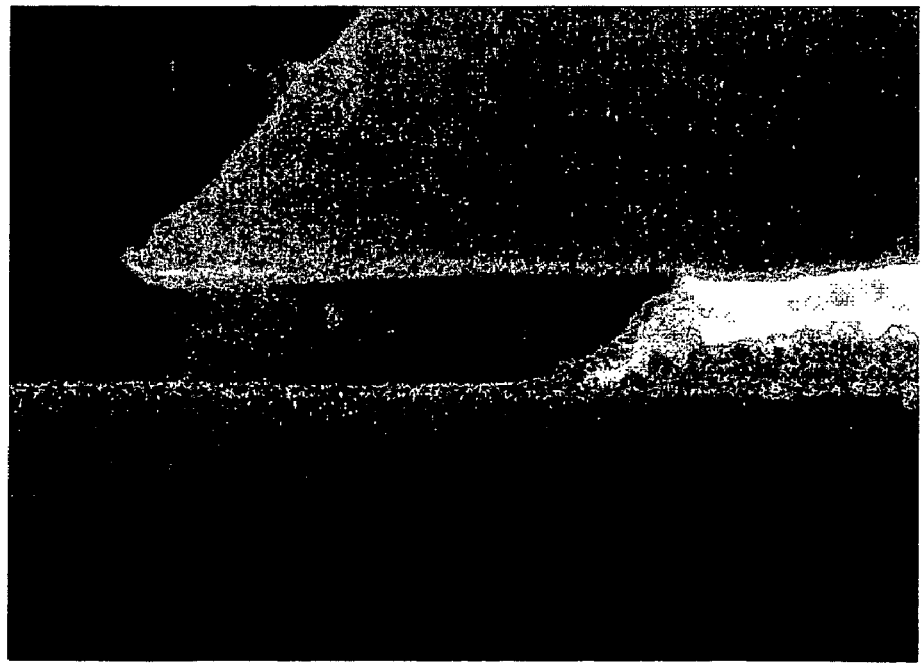
FIG. 4 is a picture of a cross-sectional profile of a metallic interconnection line according to an embodiment of the present invention.

On the other hand, as can be seen in FIG. 4, when an etchant according to an embodiment of the present invention is used to etch triple-layered interconnection 2, the high etch selectivity of the etchant demonstrates superior etching uniformity and a good tapered lateral profile having an acute angle can be formed without influencing the adhesion of the triple-layered interconnection line 2 to the substrate 1. Moreover, as seen in FIG. 4, a superior dimension skew of about 1.5-2.0 μm can be obtained, thereby providing linearity of the triple-layered pattern. Furthermore, since the triple layer used in the illustrative embodiment of the present invention includes the MoN layer as the topmost layer, the Cu layer is not directly exposed to the etchant during etching. In addition, since the MoN layer directly exposed to the etchant has high chemical resistance against the etchant, the Cu layer can be protected from the etchant. Thus, oxidation and corrosion of the Cu layer can be prevented. The etchant and the method for fabricating the Mo/Cu/MoN triple-layered interconnection line using the etchant may also be applied to a method for fabricating a TFT substrate.

Figure 5A:
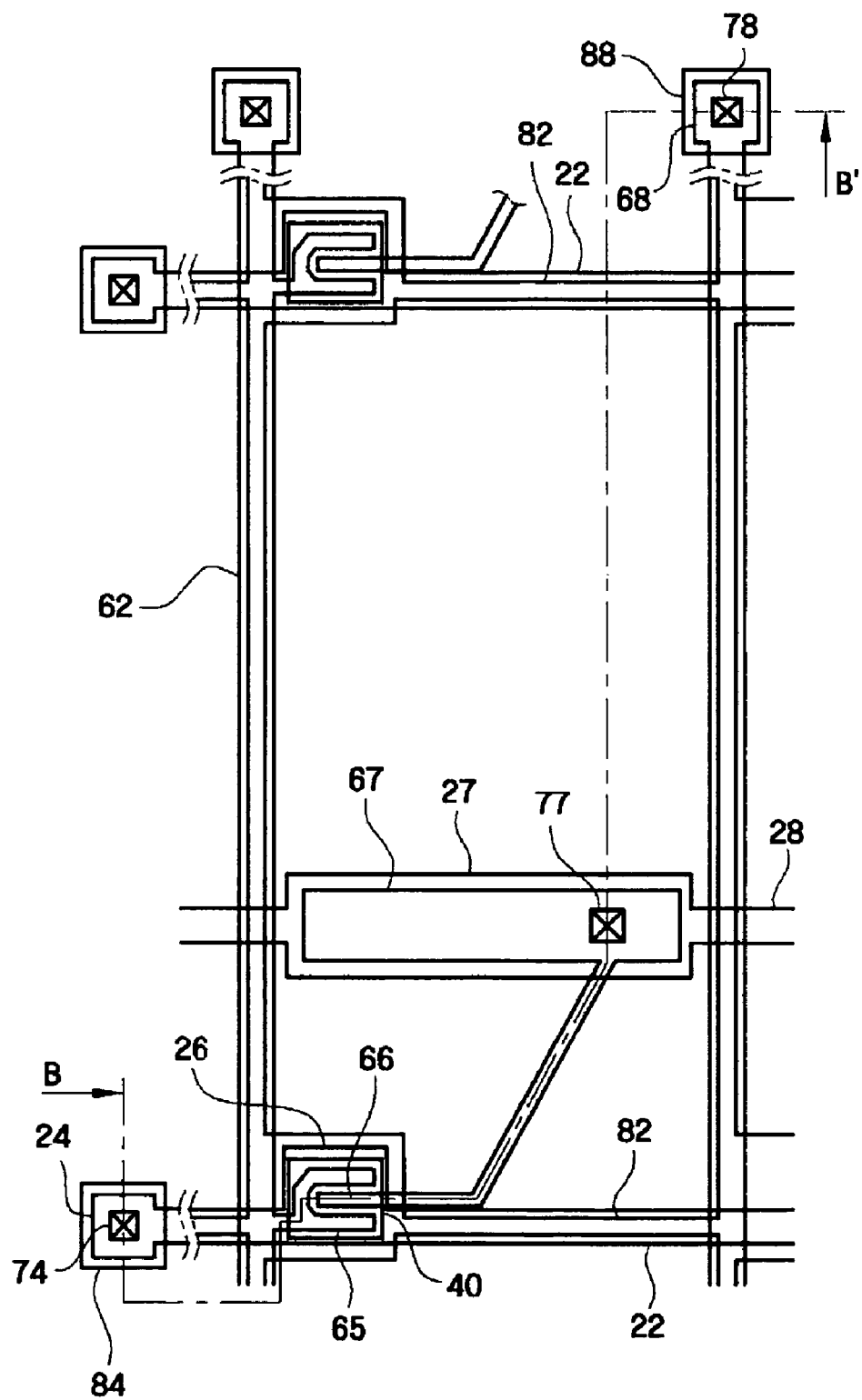
FIG. 5A is a layout of a thin film transistor (TFT) substrate fabricated using a method for fabricating a TFT substrate according to an embodiment of the present invention.
Figure 5B:
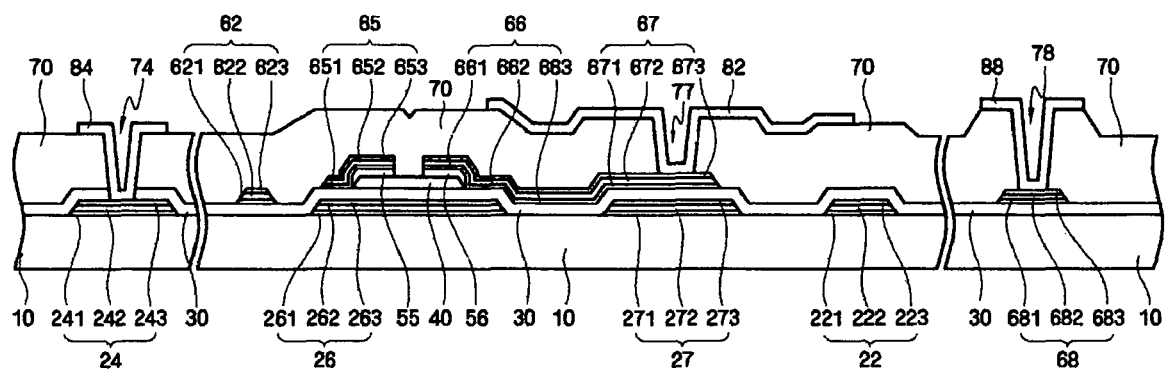
FIG. 5B is a cross-sectional view taken along the line B-B' of FIG. 5A.

Hereinafter, a method for fabricating a TFT substrate according to an embodiment of the present invention will be described with reference to the accompanying drawings. First, the structure of a TFT substrate fabricated by the method will be described with reference to FIGS. 5A and 5B. FIG. 5A is a layout of a thin film transistor (TFT) substrate fabricated using a method for fabricating a TFT substrate according to an embodiment of the present invention, and FIG. 5B is a cross-sectional view taken along a line B-B' of FIG. 5A. A plurality of gate interconnection lines transmitting a gate signal are formed on an insulating substrate 10. The gate interconnection lines include a gate line 22 extending in a transverse direction, a gate pad 24 that is connected to the end of the gate line 22 to receive a gate signal from the outside and transmits the same to the gate line 22, a gate electrode 26 of a protruding TFT that is connected to the gate line 22, and a storage electrode 27 and a storage electrode line 28 formed parallel to the gate line 22.

The storage electrode line 28 extends in a transverse direction across a pixel region and is connected to the storage electrode 27, which is wider than the storage electrode line 28. The storage electrode 27 overlaps with a drain electrode extension portion 67 connected with a pixel electrode 82 to form storage capacitors for enhancing the charge storing capacity of pixels. The shapes and arrangements of the storage electrode 27 and the storage electrode line 28 may vary, and the storage electrode 27 and the storage electrode line 28 may be omitted when the overlapping of the pixel electrode 82 and the gate line 22 gives sufficient storage capacitance.

The gate interconnection lines are formed of triple layers 22, 24, 26, 27, and 28. The triple-layered gate line 22 includes conductive layers 221, 222, and 223. The triple layer 24 includes conductive layers 241, 242, and 243. The triple layer 26 includes conductive layers 261, 262, and 263. The triple layer 27 includes conductive layers 271, 272, and 273. The conductive layers 221, 241, 261, and 271 are formed of Mo or a Mo alloy (hereinafter, referred to as "Mo layers"). The conductive layers 222, 242, 262, and 272 are formed of Cu or a Cu alloy (hereinafter, referred to as "Cu layers"). The conductive layers 223, 243, 263, and 273 are formed of MoN (hereinafter, referred to as "MoN layers"). Although not shown in FIG. 5B, the storage electrode line 28 also has the same triple layer structure as the triple layers 22, 24, 26, and 27. The following description of the gate interconnection lines having the triple layer structures includes the storage electrode line 28.

The structures and functions of the triple layers 22, 24, 26, 27, and 28 are the same as those of the above-described triple layers in the method for fabricating an interconnection line according to an embodiment of the present invention. A gate insulating layer 30 is formed of silicon nitride (SiNx) on the substrate 10 and the triple layered gate interconnection lines 22, 24, 26, 27, and 28. A semiconductor layer 40 is formed of amorphous silicon hydride or polycrystalline silicon in the shape of an island on the gate insulating layer 30 on the gate electrode 26. Ohmic contact layers 55 and 56 are formed of silicide or n+ amorphous silicon hydride heavily doped with n-type impurities, on the semiconductor layer 40.

Data interconnection lines are formed on the ohmic contact layers 55 and 56 and the gate insulating layer 30. The data interconnection lines include a data line 62 that is formed in a longitudinal direction and intersects the gate line 22 to define a pixel, a source electrode 65 that is a branch of the data line 62 and extends onto the ohmic contact layer 55, a data pad 68 that is connected to an end of the data line 62 and receives an image signal from the outside, a drain electrode 66 that is separated from the source electrode 65 and is formed on the ohmic contact layer 56 opposite to the source electrode 65 around the gate electrode 26 or a channel area of a TFT, and a drain electrode extension portion 67 with a large area that extends from the drain electrode 66 and overlaps with the storage electrode 27.

The data interconnection lines are formed of the triple layers 62, 65, 66, 67, and 68. The triple-layered data line 62 includes conductive layers 621, 622, and 623. The triple-layered source electrode 65 includes conductive layers 651, 652, and 653. The triple-layered drain electrode 66 includes conductive layers 661, 662, and 663. The triple layer 67 includes conductive layers 671, 672, and 673. The triple layer 68 includes conductive layers 681, 682, and 683. The conductive layers 621, 651, 661, 671, and 681 are formed of Mo or a Mo alloy (hereinafter, referred to as "Mo layers"). The conductive layers 622, 652, 662, 672, and 682 are formed of Cu or a Cu alloy (hereinafter, referred to as "Cu layers"). The conductive layers 623, 653, 663, 673, and 683 are formed of MoN (hereinafter, referred to as "MoN layers"). Here, since the structures and functions of the Mo layers 621, 651, 661, 671, and 681 and the MoN layers 623, 653, 663, 673, and 683 are the same as those in the gate interconnection lines, an explanation thereof will not be given.

At least a portion of the source electrode 65 and a portion of the drain electrode 66 overlap the semiconductor layer 40. The source electrode 65 and the drain electrode 66 are located opposite to each other around the gate electrode 26. Here, the ohmic contact layers 55 and 56 are interposed between the underlying semiconductor layer 40 and the overlying source electrode 65 and between the semiconductor layer 40 and the drain electrodes 66 to reduce the contact resistance between them.

The drain electrode extension portion 67 overlaps with the storage electrode 27 to form storage capacitance between the storage electrode 27 and the gate insulating layer 30. In the absence of the storage electrode 27, the drain electrode extension portion 67 is also omitted.

A passivation layer 70 is formed on the data interconnection lines 62, 65, 66, 67, and 68 and portions of the semiconductor layer 40 that are not covered by the data interconnection lines. Here, the passivation layer 70 is preferably made of an inorganic insulator, a photosensitive organic material having a good flatness characteristic, a low dielectric insulating material such as a-Si:C:O and a-Si:O:F formed by plasma enhanced chemical vapor deposition (PECVD), or an inorganic material such as SiNx. When the passivation layer 70 is formed of an organic material, an insulating layer (not shown) formed of SiNx or silicon oxide (SiO2) may further be formed under the passivation layer 70 to prevent the organic material of the passivation layer 70 from contacting a portion of the semiconductor layer 40 between the source electrode 65 and the drain electrode 66.

Contact holes 77 and 78 that expose the drain electrode extension portion 67 and the data pad 68 are formed in the passivation layer 70. A contact hole 74 that exposes the gate pad 24 is formed in the passivation layer 70 and the gate insulating layer 30. A pixel electrode 82 that is electrically connected to the drain electrode 66 through the contact hole 77 and is located in a pixel is formed on the passivation layer 70. Electric fields are generated between the pixel electrode 82 supplied with the data voltage and the common electrode of the upper display panel, which determine an orientation of liquid crystal molecules in the LC layer between the pixel electrode 82 and the common electrode.

A subsidiary gate pad 84 connected to the gate pad 24 through the contact hole 74 and a subsidiary data pad 88 connected to the data pad 68 through the contact hole 78 are formed on the passivation layer 70. The pixel electrode 82, the subsidiary gate pad 84, and the subsidiary data pad 88 are formed of ITO.

Figure 6A:
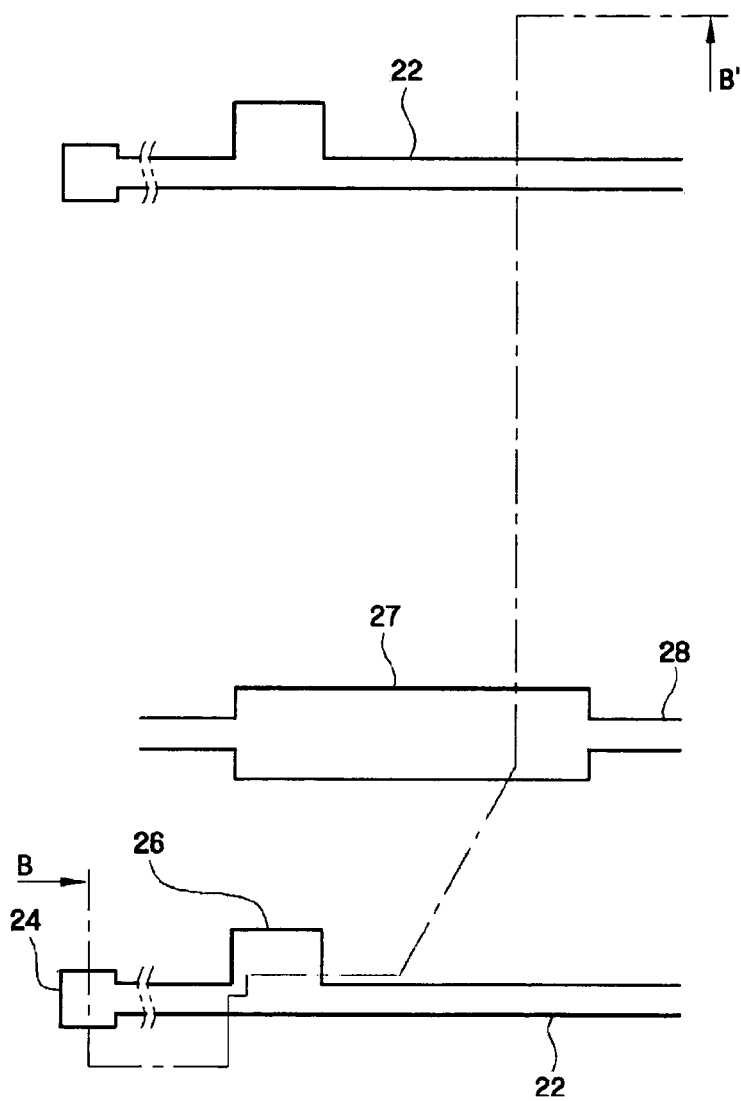
FIGS. 6A, 7A, 8A, and 9A are layouts sequentially illustrating a method for fabricating a TFT substrate according to an embodiment of the present invention.
Figure 6B:
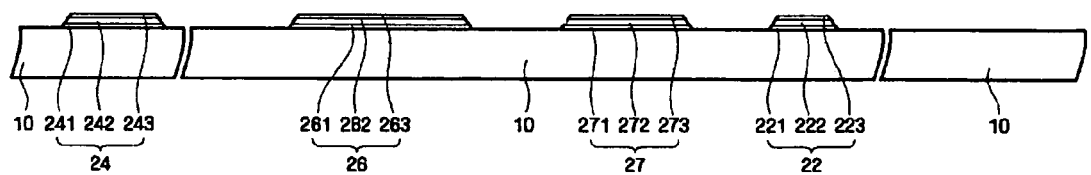
FIGS. 6B, 7B, 8B, and 9B are cross-sectional views taken along lines B-B' of FIGS. 6A, 7A, 8A, and 9A.

Hereinafter, a method for fabricating a TFT substrate according to an embodiment of the present invention will be described in detail with reference to FIGS. 5A and 5B and FIGS. 6A through 9B. First, as shown in FIGS. 6A and 6B, Mo or a Mo alloy, Cu or a Cu alloy, and MoN are sequentially deposited on the insulating substrate 10, thereby forming the triple-layered gate lines 22, 24, 26, 27, and 28 including the Mo layers 221, 241, 261, and 271, the Cu layers 22, 242, 262, and 272, and the MoN layers 223, 243, 263, and 273.

According to an embodiment of the present invention, the triple-layered gate interconnection lines 22, 24, 26, 27, and 28 are formed using photolithography using the same high selectivity wet etchant as that described with reference to FIGS. 1 through 4 which produces a good tapered lateral profile having an acute angle and superior dimension skew without adversely influencing the adhesion of the triple-layered gate interconnection lines to substrate 10. In such a manner, as shown in FIGS. 6A and 6B, the gate interconnection lines including the gate line 22, the gate electrode 26, the gate pad 24, the storage electrode 27, and the storage electrode line 28 are formed.

Figure 7A:
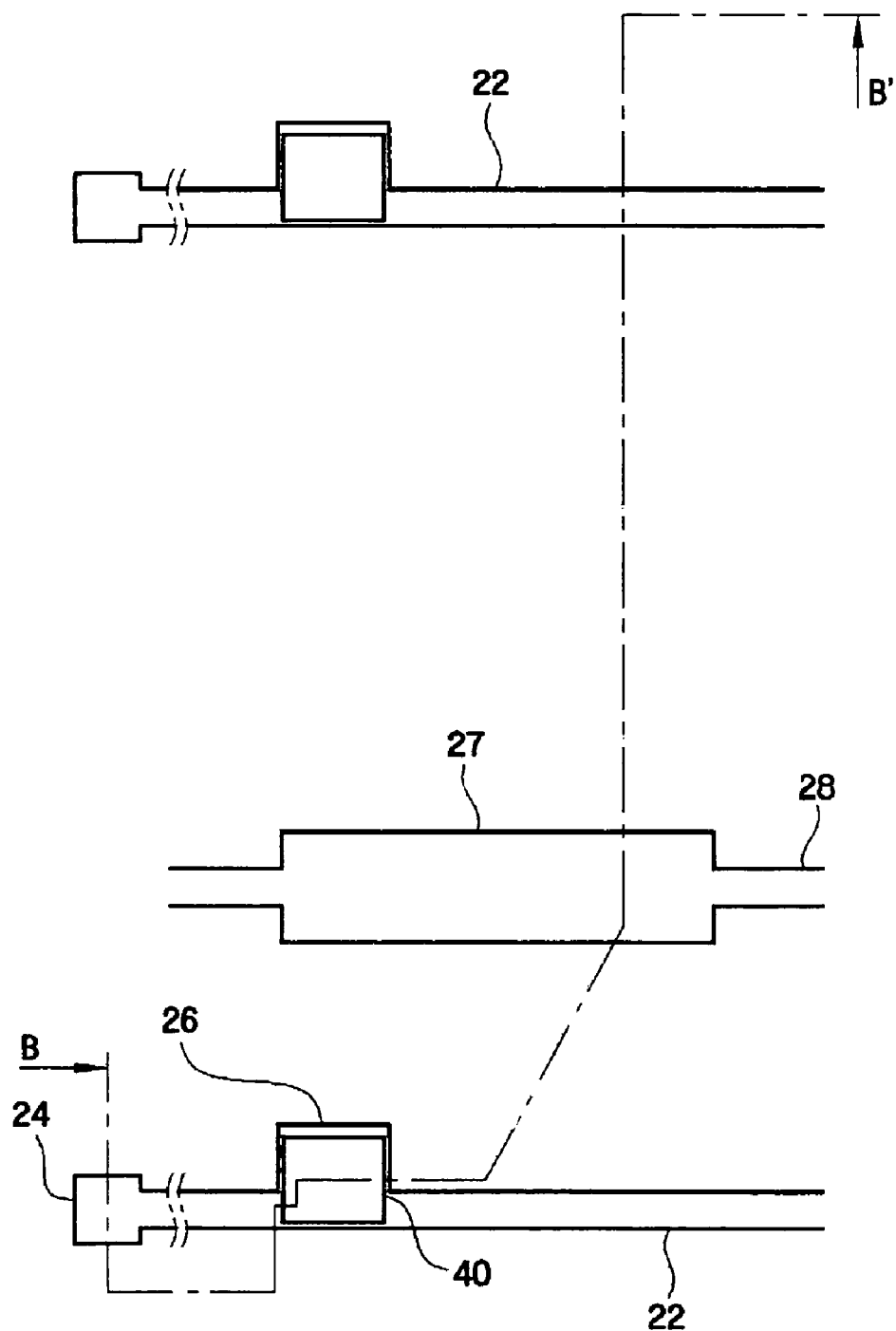
Figure 7B:
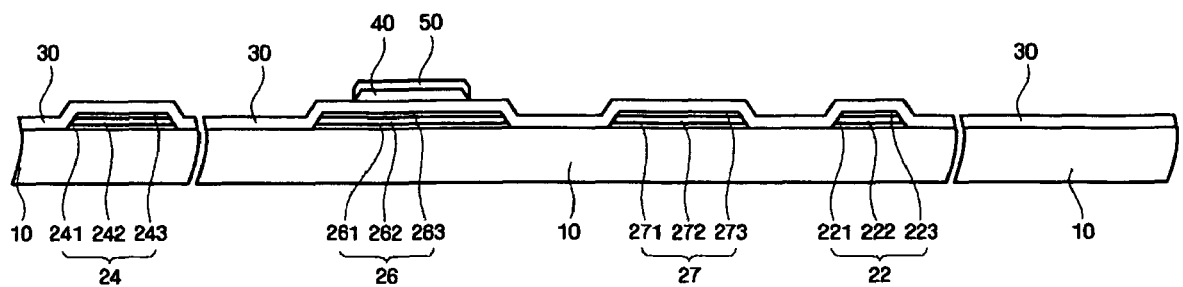

Next, as shown in FIGS. 7A and 7B, the gate insulating layer 30 formed of silicon nitride, an intrinsic amorphous silicon layer, and a doped amorphous silicon layer are continuously deposited to thicknesses of 1500-5000 Å, 500-2000 Å, and 300-600 Å, using, for example, chemical vapor deposition (CVD). Photolithography is performed on the intrinsic amorphous silicon layer and the doped amorphous silicon layer to form the semiconductor layer 40 taking the shape of an island and form the ohmic contact layers 55 and 56 on the gate insulating layer 30 on the gate electrode 24.

Figure 8A:
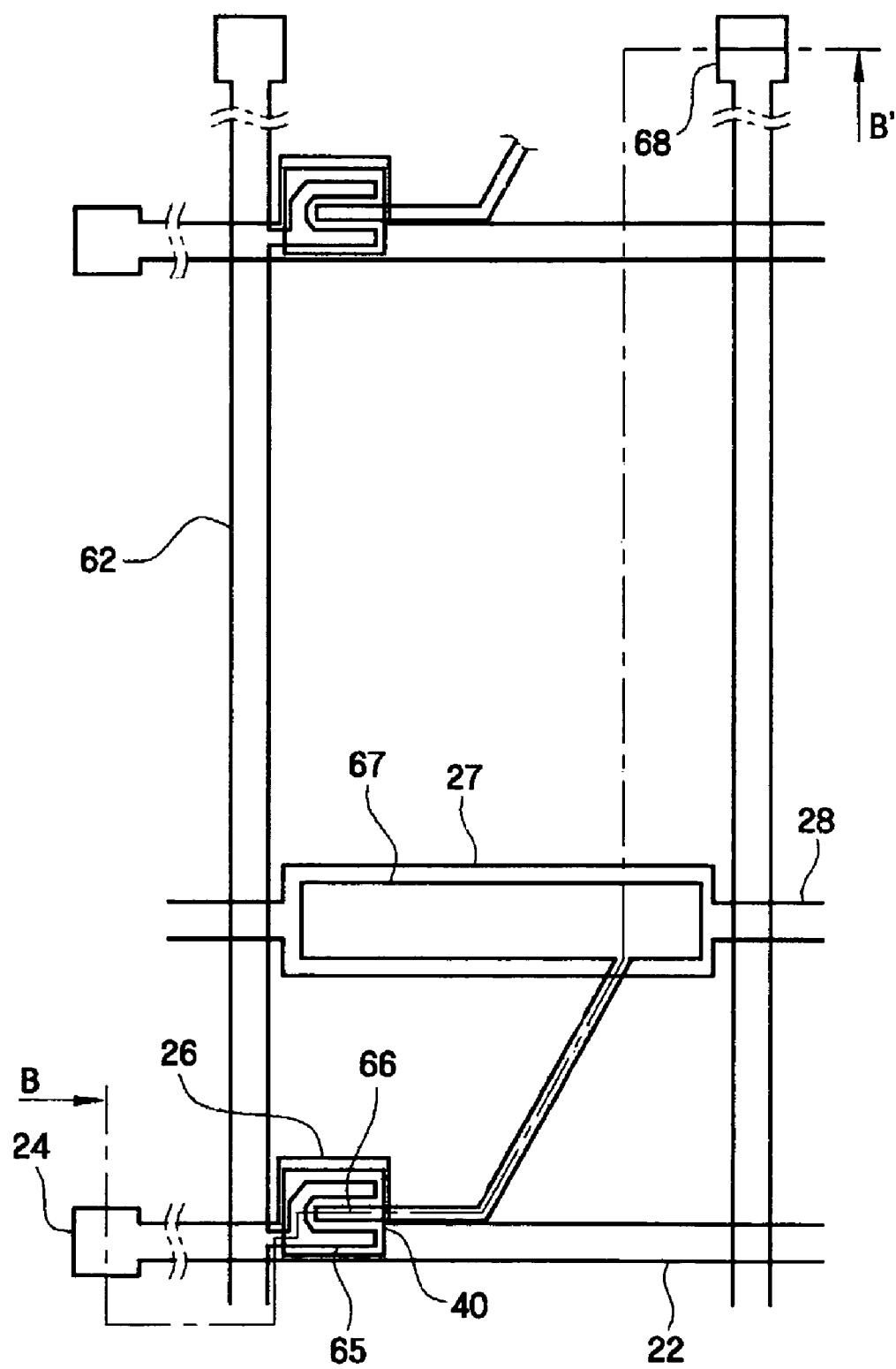
Figure 8B:
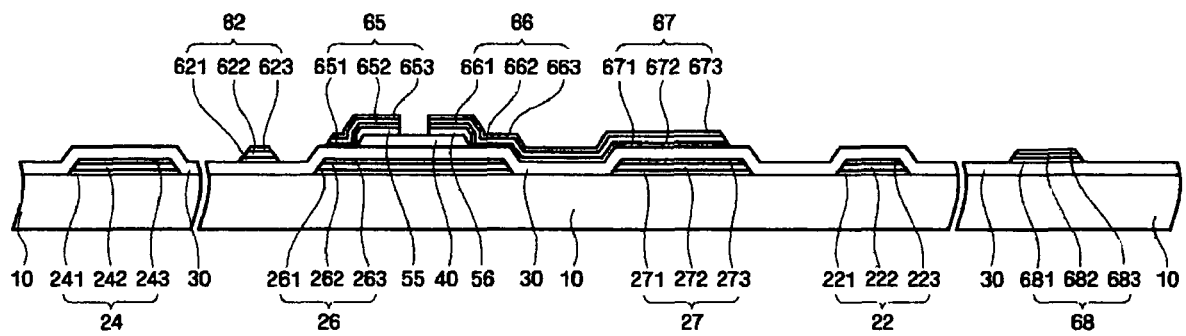

Next, as shown in FIGS. 8A and 8B, the triple-layered data interconnection lines 62, 65, 66, 67, and 68 in which the Mo layers 621, 651, 661, 671, and 681, the Cu layers 622, 652, 662, 672, and 682, and the MoN layers 623, 653, 663, 673, and 683 are sequentially deposited are formed on the gate insulating layer 30, the exposed portion of the semiconductor layer 40, and the ohmic contact layers 55 and 56 by sputtering. Here, a method of depositing the Mo layers 621, 651, 661, 671, and 681, the Cu layers 622, 652, 662, 672, and 682, and the MoN layers 623, 653, 663, 673, and 683 is the same as the method of depositing the Mo layers 221, 241, 261, and 271, the Cu layers 222, 242, 262, and 272, and the MoN layers 223, 243, 263, and 273 in a process of forming the gate interconnection lines, an explanation thereof will not be given. Subsequently, photolithography is performed on the triple-layered data lines. The etching may be wet etching using an etchant. The etchant is the same as that described with reference to FIGS. 1 through 4 and a repetitive description thereof will be omitted.

When etching is performed using the etchant according to an embodiment of the present invention, since the etchant has a high etch selectivity when used to etch the triple-layered gate lines and demonstrates superior etching uniformity, a good tapered lateral profile having an acute angle can be obtained and superior dimension skew can be obtained without influencing adhesion of the triple-layered data interconnection lines 62, 65, 66, 67, and 68 with respect to the gate insulating layer 30 and the ohmic contact layers 55 and 56.

Thus, the data interconnection lines 62, 65, 66, 67, and 68 are formed, which include the data line 62 that intersects the gate line 22, the source electrode 65 that is connected to the data line 62 and extends onto the gate electrode 26, the data pad 68 that is connected to an end of the data line 62, the drain electrode 66 that is separated from the source electrode 65 and is located opposite to the source electrode 65 around the gate electrode 26, and the drain electrode extension protrusion 67 with a large area that extends from the drain electrode 66 and overlaps with the storage electrode 27. The data interconnection lines 62, 65, 66, 67, and 68 are branched to both sides of the gate electrode 26 by etching portions of the doped amorphous silicon layer that are not covered by the data interconnection lines, and a portion of the semiconductor layer 40 between the ohmic contact layers 55 and 56 is exposed. Here, it is desirable to perform oxygen plasma processing to stabilize the surface of the exposed portion of the semiconductor layer 40.

Figure 9A:
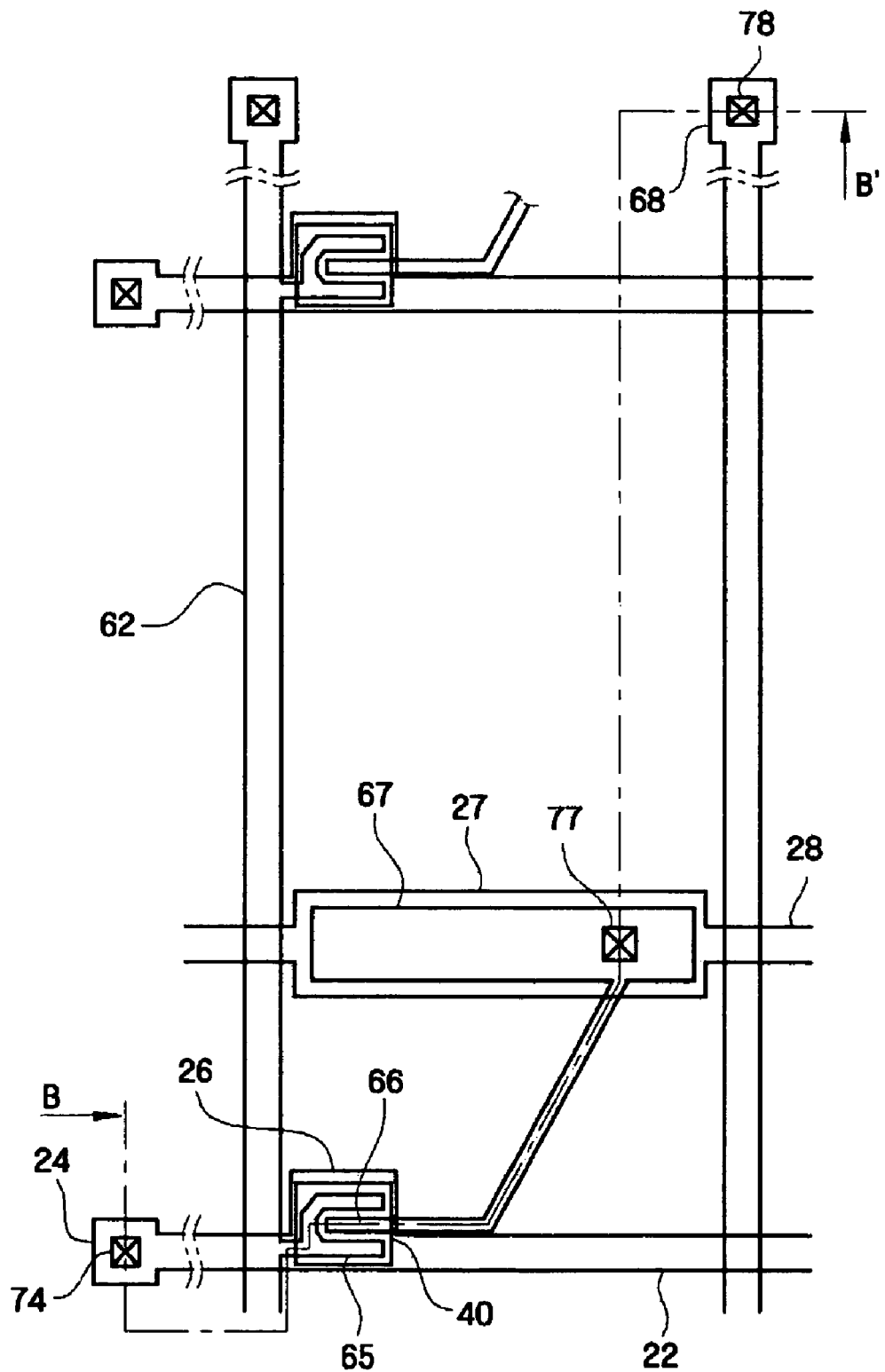
Figure 9B:
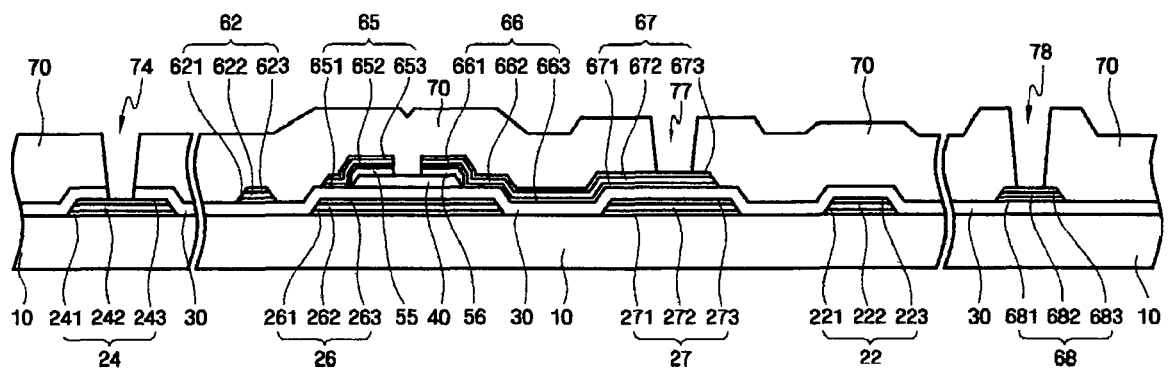

Next, as shown in FIGS. 9A and 9B, the passivation layer 70 is a single layer or multiple layers including an organic material a good characteristic, or a low dielectric insulating material such as a-Si:C:O and a-Si:O:F formed by plasma enhanced chemical vapor deposition (PECVD), an insulating material having a low dielectric constant, such as a-Si:O:F, or an inorganic material such as SiNx. Next, the gate insulating layer 30 and the passivation layer 70 are patterned by photolithography, thereby forming the contact holes 74, 77, and 78 that expose the gate pad 24, the drain electrode extension protrusion 67, and the data pad 68. Here, when the passivation layer 70 is an organic layer having photosensitivity, the contact holes 74, 77, and 78 may be formed only by photolithography. It is desirable to form the contact holes 74, 77, and 78 under an etching condition in which the gate insulating layer 30 and the passivation layer 70 have the same selectivity.

Finally, as shown in FIGS. 5A and 5B, an ITO layer is deposited and photolithography is performed to form the pixel electrode 82 connected to the drain electrode 66 through the contact hole 77, form the subsidiary gate pad 84 connected to the gate pad 24 through the contact hole 74, and form the subsidiary data pad 88 connected to the data pad 68 through the contact hole 78. Although a gate line and a data line are formed of a triple-layer structure including a Mo layer, a Cu layer, and a MoN layer on a substrate in this embodiment of the present invention, only one of the gate line and the data line may be formed of a triple-layered structure.

A semiconductor layer and a data interconnection line are formed through photolithography using different masks in the above description, but they can also be formed through photolithography using a single photoresist film pattern as in the following description. The structure of a unit pixel of a TFT substrate fabricated by a method for fabricating a TFT substrate according to another embodiment of the present invention will be described with reference to FIGS. 10A through 19B.

The plurality of gate interconnection lines 22, 24, 26, 27, and 28 transmitting a gate signal are formed of triple layers on the insulating substrate 10 as in the embodiment of the present invention shown in FIGS. 5A through 9B. First, a plurality of gate interconnection lines transmitting a gate signal are formed on an insulating substrate 10. The gate interconnection lines include a gate line 22 extending in a transverse direction, a gate pad 24 that is connected to the end of the gate line 22 to receive a gate signal from the outside and transmits the same to the gate line 22, a gate electrode 26 of a protruding TFT that is connected to the gate line 22, and a storage electrode 27 and a storage electrode line 28 formed parallel to the gate line 22. The storage electrode line 28 extends in a transverse direction across a pixel region and is connected to the storage electrode 27, which is wider than the storage electrode line 28. The storage electrode 27 overlaps with a drain electrode extension portion 67 connected with a pixel electrode 82 to form storage capacitors for enhancing the charge storing capacity of pixels. The shapes and arrangements of the storage electrode 27 and the storage electrode line 28 may vary, and the storage electrode 27 and the storage electrode line 28 may be omitted when the overlapping of the pixel electrode 82 and the gate line 22 gives sufficient storage capacitance.

The gate interconnection lines (wires) 22, 24, 26, 27, 28 may be formed of a triple layers formed by sequentially depositing the Mo layers 221, 241, 261, and 271 made of Mo or Mo alloy, the Cu layers 22, 242, 262, and 272 made of Cu or Cu alloy, and the MoN layers 223, 243, 263, and 273, like in the embodiment of the present invention shown in FIGS. 5A through 9B. A gate insulating layer 30 is formed of silicon nitride (SiNx) on the substrate 10 and the triple layered gate interconnection lines 22, 24, 26, 27, and 28.

Semiconductor patterns 42, 44, and 48 are formed amorphous silicon hydride or polycrystalline silicon on the gate insulating layer 30. Ohmic contact layers 52, 55, 56 and 58 made of silicide or n+ amorphous silicon hydride heavily doped with n-type impurities are formed on the semiconductor patterns 42, 44, and 48. Data interconnection lines are formed on the ohmic contact layers 52, 55, 56, and 58 and the gate insulating layer 30. The data interconnection lines include a data line 62 that is formed in a longitudinal direction and intersects the gate line 22 to define a pixel, a source electrode 65 that is a branch of the data line 62 and extends onto the ohmic contact layer 55, a data pad 68 that is connected to an end of the data line 62 and receives an image signal from the outside, a drain electrode 66 that is separated from the source electrode 65 and is formed on the ohmic contact layer 56 opposite to the source electrode 65 around the gate electrode 26 or a channel area of a TFT, and a drain electrode extension portion 67 with a large area that extends from the drain electrode 66 and overlaps with the storage electrode 27.

The data interconnection lines are formed of the triple layers 62, 65, 66, 67, and 68. The triple-layered data line 62 includes conductive layers 621, 622, and 623. The triple-layered source electrode 65 includes conductive layers 651, 652, and 653. The triple-layered drain electrode 66 includes conductive layers 661, 662, and 663. The triple layer 67 includes conductive layers 671, 672, and 673. The triple layer 68 includes conductive layers 681, 682, and 683. The conductive layers 621, 651, 661, 671, and 681 are formed of Mo or a Mo alloy (hereinafter, referred to as "Mo layers"). The conductive layers 622, 652, 662, 672, and 682 are formed of Cu or a Cu alloy (hereinafter, referred to as "Cu layers"). The conductive layers 623, 653, 663, 673, and 683 are formed of MoN (hereinafter, referred to as "MoN layers").

At least a portion of the source electrode 65 and a portion of the drain electrode 66 overlap the semiconductor layer 40. The source electrode 65 and the drain electrode 66 are located opposite to each other around the gate electrode 26. Here, the ohmic contact layers 55 and 56 are interposed between the underlying semiconductor layer 40 and the overlying source electrode 65 and between the semiconductor layer 40 and the drain electrodes 66 to reduce the contact resistance between them. The drain electrode extension portion 67 overlaps with the storage electrode 27 to form storage capacitance between the storage electrode 27 and the gate insulating layer 30. In the absence of the storage electrode 27, the drain electrode extension portion 67 is also omitted.

The ohmic contact layers 52, 55, 56 and 58 reduces the contact resistance between the underlying semiconductor patterns 42, 44, and 48 and the overlying data interconnection lines 62, 65, 66, 67, and 68 and have completely the same shapes as the data interconnection lines 62, 65, 66, 67, and 68.

Semiconductor patterns 42, 44, and 48 have substantially the same shapes as the data interconnection lines 62, 65, 66, 67, and 68 and the ohmic contact layers 52, 55, 56 and 58 except for TFT channel areas. That is to say, the source and the drain electrodes 65 and 66 are separated from each other at the TFT channel areas, where the ohmic contact layer 55 underlying the source electrode 65 and the ohmic contact layer 56 underlying the drain electrode 66 are also separated from each other. However, the TFT semiconductor pattern 44 continues to proceed there without disconnection to form a TFT channel.

The passivation layer 70 is formed on the data interconnection lines 62, 65, 66, 67, and 68 and portions of the semiconductor pattern 44 that are not covered by the data interconnection lines 62, 65, 66, 67, and 68. Here, the passivation (protective) layer 70 is preferably made of a photosensitive organic material having a good flatness characteristic, a low dielectric insulating material such as a-Si:C:O and a-Si:O:F formed by plasma enhanced chemical vapor deposition (PECVD), or an inorganic insulator such as silicon nitride or silicon oxide. When the passivation layer 70 is formed of an organic material, an insulating layer (not shown) formed of SiNx or silicon oxide (SiO2) may further be formed under the passivation layer 70 to prevent the organic material of the passivation layer 70 from contacting a portion of the semiconductor pattern 44 between the source electrode 65 and the drain electrode 66.

Contact holes 77 and 78 that expose the drain electrode extension portion 67 and the data line pad 68 are formed in the passivation layer 70. A contact hole 74 that exposes the gate pad 24 is formed in the passivation layer 70 and the gate insulating layer 30. A subsidiary gate pad 84 connected to the gate pad 24 through the contact hole 74 and a subsidiary data pad 88 connected to the data pad 68 through the contact hole 78 are formed on the passivation layer 70. The pixel electrode 82, the subsidiary gate pad 84, and the subsidiary data pad 88 are formed of ITO.

Figure 10A:
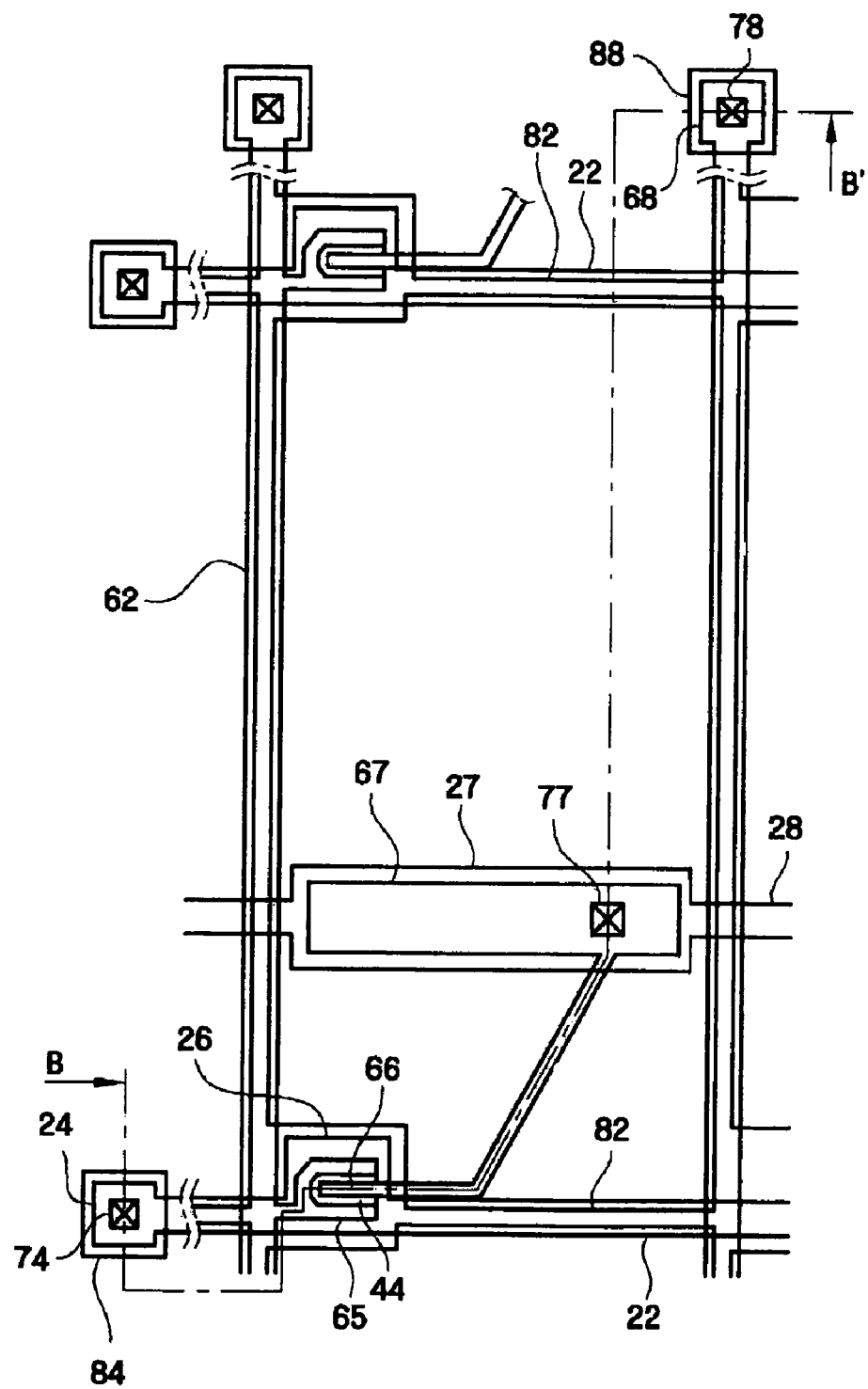
FIG. 10A is a layout illustrating a TFT substrate fabricated using a method for fabricating a TFT substrate according to another embodiment of the present invention.
Figure 10B:
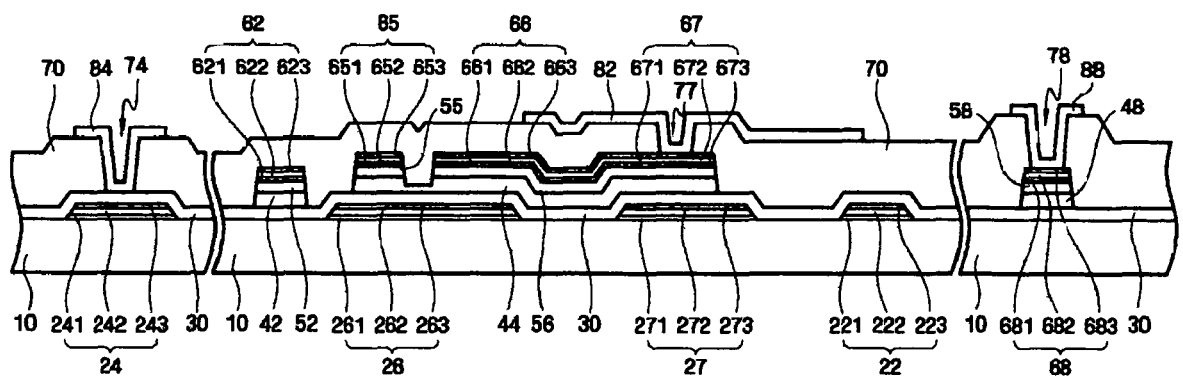
FIG. 10B is a cross-sectional view taken along the line B-B' of FIG. 10A.
Figure 11A:
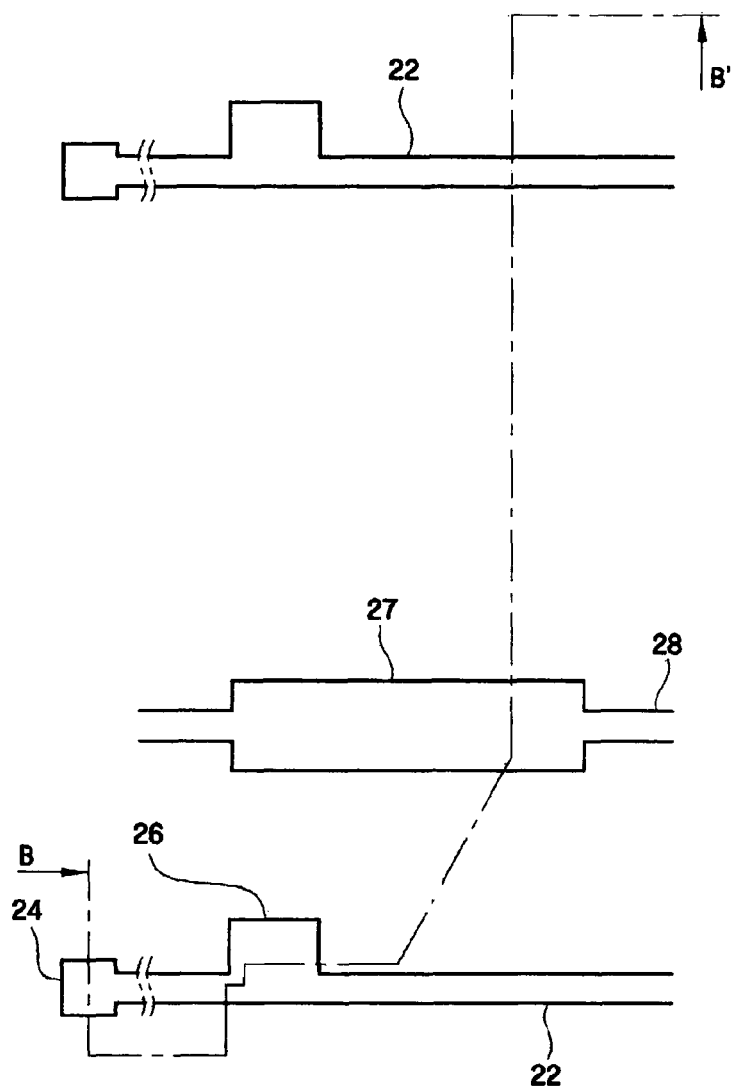
FIGS. 11A, 13A, and 19A are layouts sequentially illustrating a method for fabricating a TFT substrate according to another embodiment of the present invention.
Figure 11B:
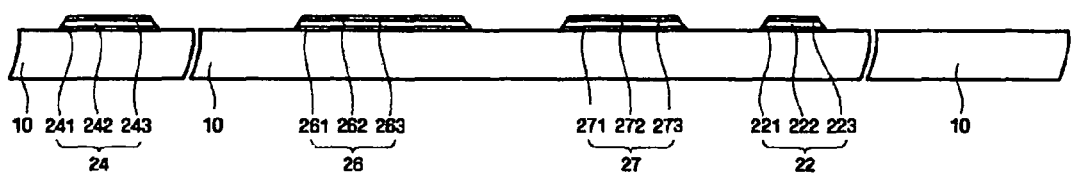
FIGS. 11B and 12 are cross-sectional views taken along the line B-B' of FIG. 11A, for illustrating processing steps.

Hereinafter, a method for fabricating a TFT substrate according to another embodiment of the present invention will be described with reference to FIGS. 10A and 10B and FIGS. 11A through 19A. As shown in FIGS. 11A and 11B, triple-layered gate lines 22, 24, 26, 27, and 28, which are formed by sequentially depositing Mo layers 221, 241, 261, 271, Cu layers 222, 242, 262, 272, and MoN layers 223, 243, 263, 273, are formed, like in the embodiment shown in FIGS. 5A through 9B. Next, photolithography is performed on the triple-layered gate lines 22, 24, 26, 27, and 28. The etching may be wet etching using the same etchant as that described with reference to FIGS. 1 through 4 and a repetitive explanation thereof will be omitted.

Figure 12:
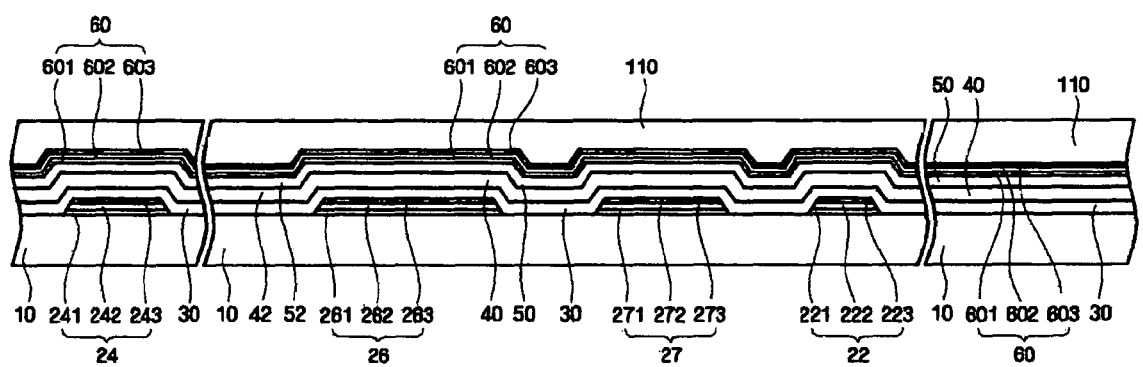

In such a manner, as shown in FIGS. 11A and 11B, the gate interconnection lines including the gate line 22, the gate electrode 26, the gate pad 24, the storage electrode 27, and the storage electrode line 28 are formed. Next, as shown in FIG. 12, the gate insulating layer 30 formed of silicon nitride, a intrinsic amorphous silicon layer 40, and a doped amorphous silicon layer 50 are continuously deposited to thicknesses of, for example, 1500-5000 Å, 500-2000 Å, and 300-600 Å using CVD. A triple-layered data line 60 in which a Mo layer 601, a Cu layer 602, and a MoN layer 603 are sequentially stacked is then formed on the doped amorphous silicon layer 50 using sputtering. The method for depositing the triple-layered data line 60 is the same as the method for depositing the triple-layered data line in the embodiment of FIGS. 5A through 9B.

Figure 13A:
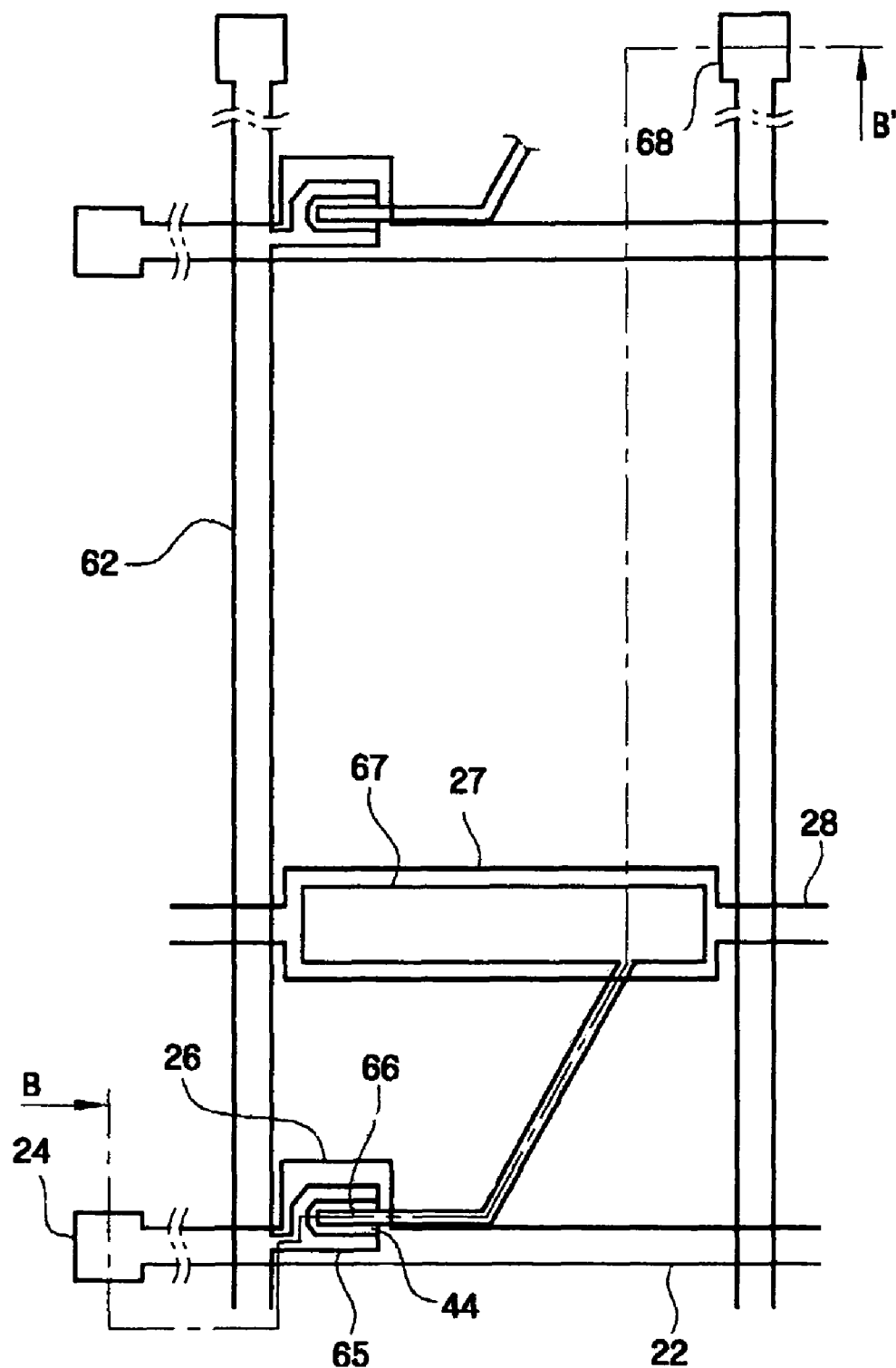
Figure 13B:
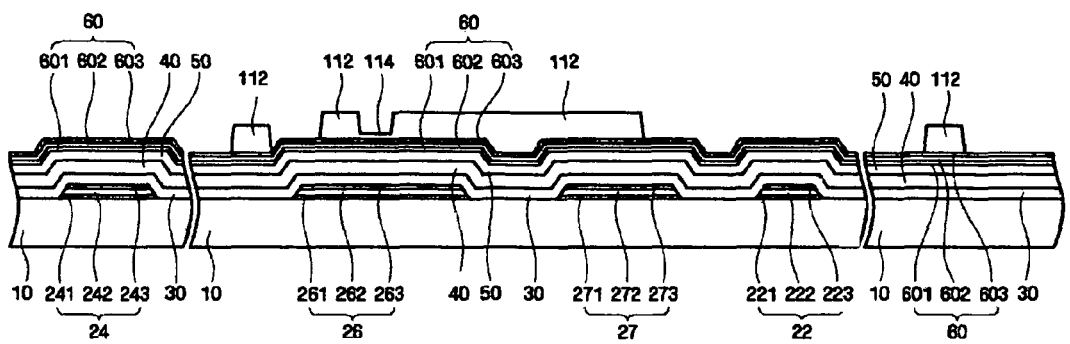

Then, a photoresist film 110 is coated onto the triple-layered data line 60. Next, referring to FIGS. 13A through 18, the photoresist film 110 is exposed to light through a mask and is developed to form photoresist film patterns 112 and 114 as shown in FIG. 13B. Here, in the photoresist film patterns 112 and 114, each of the first portions of the photoresist film patterns 112 and 114, that is, portions corresponding to the photoresist film pattern 114, is located on a channel area of a TFT, which is placed between the source electrode 65 and the drain electrode 66, and each of the second portions, that is, portions corresponding to the photoresist film pattern 112, is located on a data line area located at a place where data lines are formed. All portions of the photoresist film on the remaining areas are removed, and the first portions are made to be thinner than the second portions. Here, the ratio of the thickness of the first portion on the channel area and the second portion on the data line area is adjusted depending on process conditions of subsequent etching steps described later, and it is preferable that the thickness of the first portion is equal to or less than a half of that of the second portion, for example, equal to or less than 4,000 Å.

The position-dependent thicknesses of the photoresist film patterns 112 and 114 are obtained by several techniques. A slit pattern, a lattice pattern or a translucent film is provided on the mask in order to adjust the light transmittance. When using a slit pattern, it is preferable that width of the slits and a gap between the slits is smaller than the resolution of an exposure device used for the photolithography. In case of using a translucent film, thin films with different transmittances or different thickness may be used to adjust the transmittance on the masks.

When a photoresist film is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film blocked by a light-blocking film provided on the mask are hardly decomposed. After the photoresist film is developed, the portions containing the polymers, which are not decomposed, is left. At this time, the thickness of the portion with less light exposure is thinner than that of the portion without light exposure. Since too long an exposure time decomposes all the molecules, it is necessary to adjust the exposure time.

The position-dependent thicknesses of the photoresist film patterns 112 and 114 may be obtained using reflow. That is, the photoresist film is made of a reflowable material and exposed to light through a general mask having opaque and transparent portions. The photoresist film is then developed and subject to reflow such that portions of the photoresist film flows down onto areas without photoresist, thereby forming the thinner photoresist film portion.

Figure 14:
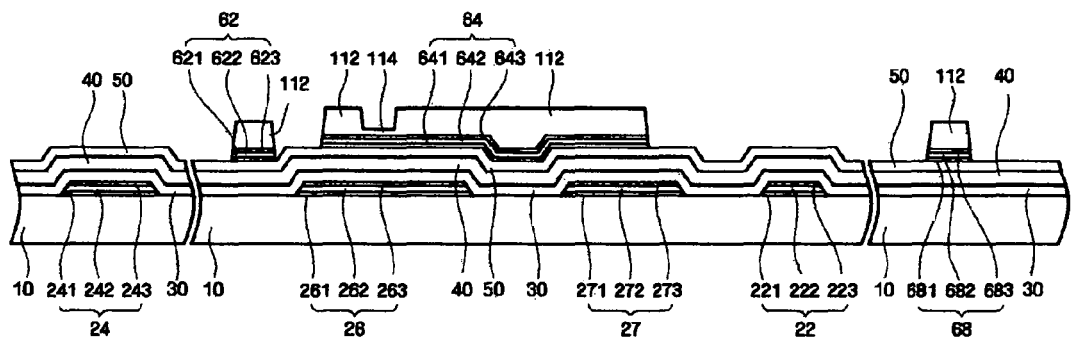

Etching is performed on the photoresist film pattern 114 and the triple-layered data line 60 including the Mo layer 603, the Cu layer 602, and the MoN layer 601. Since the etching is substantially the same as the etching for forming the data interconnection lines and etching for forming the gate interconnection lines 22, 24, 26, 28, and 29 in the embodiment of the present invention shown in FIGS. 5A through 9B, an explanation thereof will not be given. Thus, as shown in FIG. 14, only triple-layered patterns 62, 64, 67, and 68 on the channel areas and the data line areas are left and the triple-layered data line 60 of the remaining portion except for the channel areas and data line areas is entirely removed to expose the underlying portion of the doped amorphous silicon layer 50. The remaining triple-layered patterns 62, 64, 67, and 68 have substantially the same shapes as the data interconnection lines (62, 65, 66, 67, and 68 of FIG. 5B) except that the source electrode 65 and the drain electrode 66 are not disconnected from but connected to each other.

Figure 15:
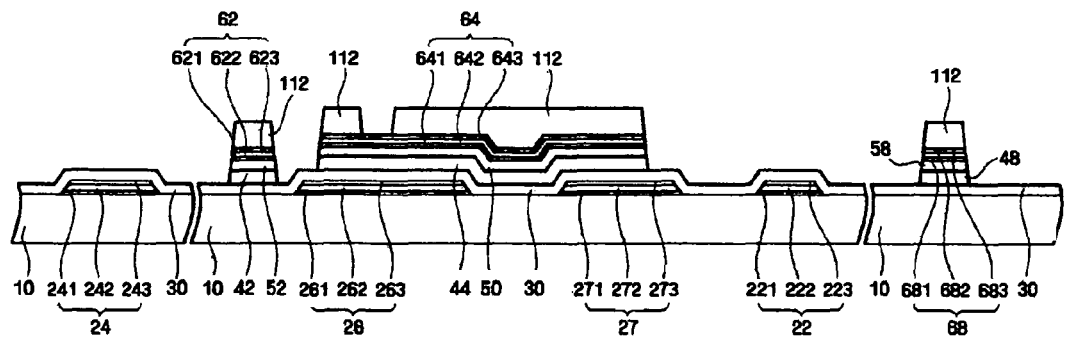

Next, as shown in FIG. 15, the exposed portions of doped amorphous silicon layer 50 and the underlying portions of the intrinsic amorphous silicon layer 40 on the other portion except for the channel and data line areas as well as the first portion of the photoresist film are simultaneously removed by dry etching. Here, the etching is performed under the condition that the photoresist film patterns 112 and 114, the doped amorphous silicon layer 50, and the intrinsic amorphous silicon layer 40 are etched simultaneously and the gate insulating layer 30 is hardly etched. In particular, it is preferable that the etching ratios for the photoresist film pattern 112 and 114 and the intrinsic amorphous silicon layer 40 are nearly the same. For instance, the etched thicknesses of the photoresist film patterns 112 and 114 and the intrinsic amorphous silicon layer 40 can be nearly the same by using a gas mixture of SF6 or HCl or a gas mixture of SF6 or O2. When the etching ratios for the photoresist film patterns 112 and 114 and for the intrinsic amorphous silicon layer 40 are the same, the initial thickness of the first portion is equal to or less than the sum of the thickness of the intrinsic amorphous silicon layer 40 and the thickness of the doped amorphous silicon layer 50.

Thus, as shown in FIG. 15, the first portions on the channel areas are removed to expose the underlying portions of the source/drain triple-layered pattern 64, and the portions of the doped amorphous silicon layer 50 and the intrinsic amorphous silicon layer 40 on the remaining areas are removed to expose the underlying portions of the gate insulating layer 30. In the meantime, the second portions on the data line areas are also etched to become thinner. Then, photoresist remnants left on the surface of the source/drain triple-layered pattern 64 on the channel areas are removed by ashing.

Figure 16:
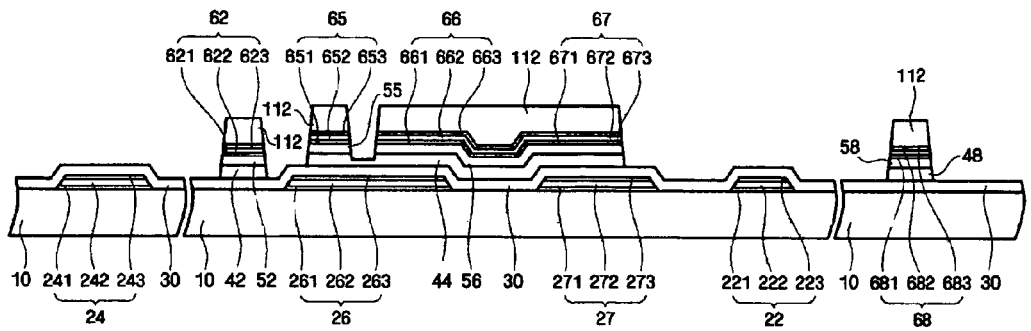

Next, as shown in FIG. 16, the triple-layered pattern 64 including the Mo layer 643 of the channel area, the Cu layer 642, and the MoN layer 641 is removed through etching. The etching may be wet etching using an etchant. The etchant is the same as that described with reference to FIGS. 1 through 4 and an explanation thereof will not be given. The ohmic contact layer formed of doped amorphous silicon is etched to be removed. Here, the etching of the ohmic contact layer may be done using dry etching. Examples of etching gases used for etching the ohmic contact layer are a gas mixture of $CF_4$ and HCl and a gas mixture of $CF_4$ and $O_2$. Use of the gas mixture of $CF_4$ and $O_2$ enables to obtain uniform thickness of etched portions of the semiconductor pattern 44 formed of intrinsic amorphous silicon. In this regard, the exposed portions of the semiconductor pattern 44 are etched to have a reduced thickness, and the second portions of the photoresist pattern 112 and 114 are also etched to have a reduced thickness. This etching is performed under the condition that the gate insulating layer 30 is not etched, and it is preferable that the photoresist pattern 112 and 114 is thick enough to prevent the second portions from being removed to expose the underlying portions of the data interconnection lines 62, 65, 66, 67, and 68.

Figure 17:
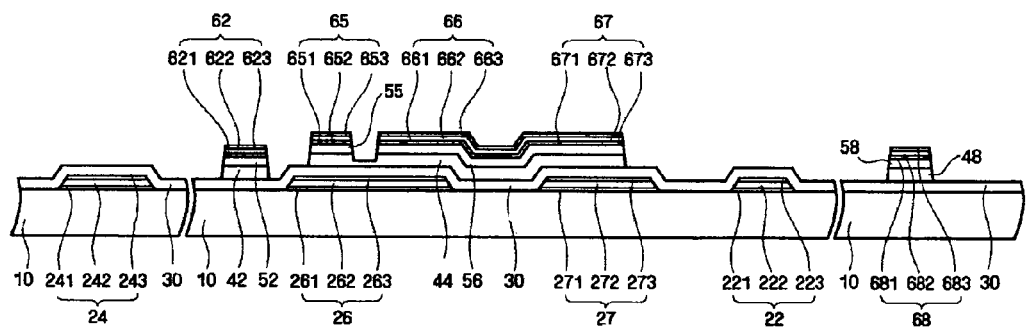
Figure 18:
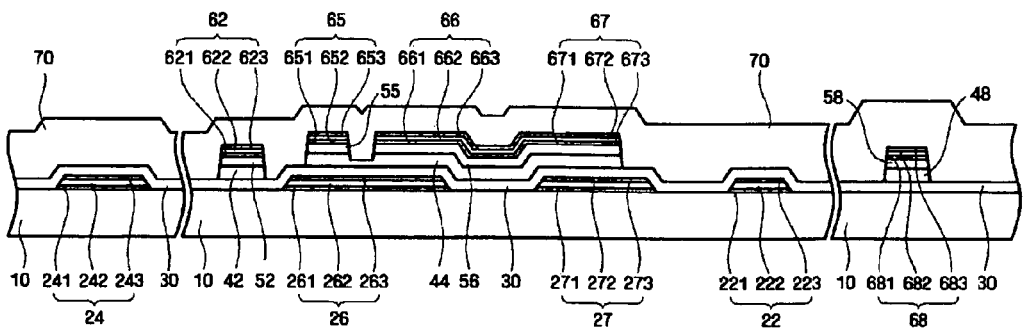

Accordingly, the source electrode 65 and the drain electrode 66 are separated from each other, and, simultaneously, the data interconnection lines 65 and 66 and the ohmic contact layers 55 and 56 thereunder are completed. Next, as shown in FIG. 17, the second portions of the photoresist film patterns 112 and 114 left on the data interconnection line area are removed. Next, as shown in FIG. 18, the passivation layer 70 is formed.

Figure 19A:
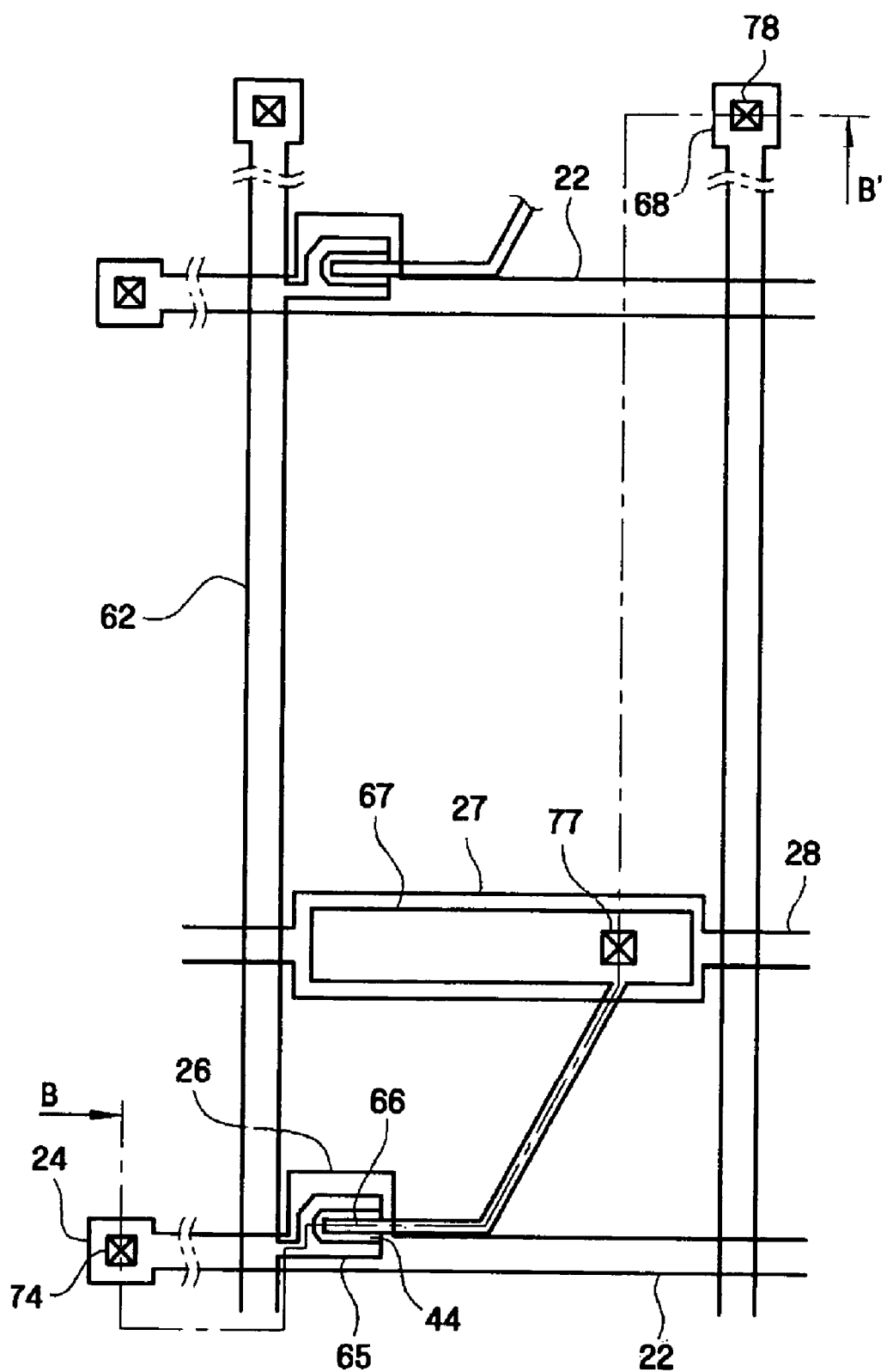
Figure 19B:
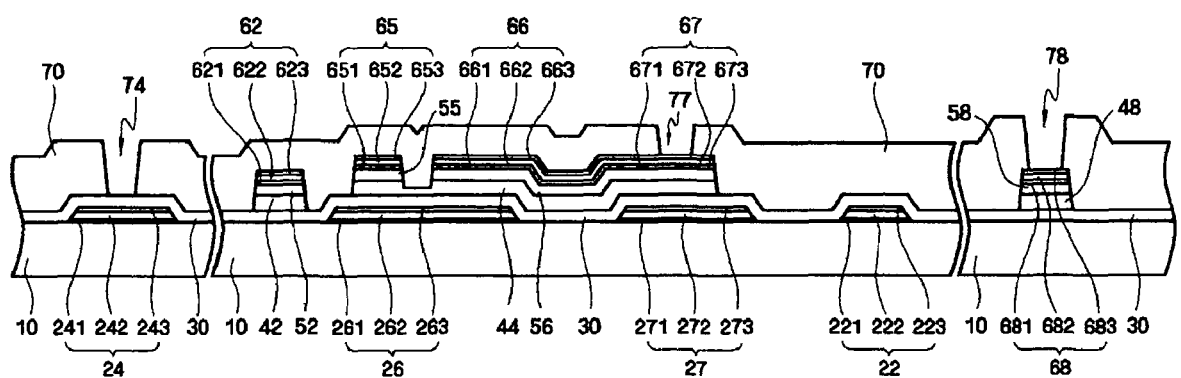
FIG. 19B is a cross-sectional view taken along the line B-B' of FIG. 19A, illustrating processing steps.

As shown in FIGS. 19A and 19B, photolithography is performed on the passivation layer 70 and the gate insulating layer 30, thereby forming the contact holes 77, 74, and 78 that expose the drain electrode extension portion 67, the gate pad 24, and the data pad 68. Finally, as shown in FIGS. 10A and 10B, an ITO layer having a thickness of 400-500 Å is deposited and undergoes photolithography, thereby forming the pixel electrode 82 connected to the drain electrode extension portion 67, the subsidiary gate pad 84 connected to the gate pad 24, and the subsidiary data pad 88 connected to the data pad 68.

It is desirable to use a nitrogen gas for a pre-heating process prior to the deposition of ITO, so as to prevent a metal oxide layer from being formed on the metal layers 24, 67, and 68 that are exposed through the contact holes 74, 77, and 78.

In another embodiment of the present invention, the underlying ohmic contact layers 52, 54, 55, 56, and 58 and the underlying semiconductor patterns 42 and 48 as well as the separation of the source electrode 65 and the drain electrode 66 are formed using a single mask, the illustrative embodiment of the present invention gives a simple manufacturing method as well as the advantage given by the first embodiment. Although the gate interconnection line and the data interconnection line are formed of triple layers including a Mo layer, a Cu layer, and a MoN layer in the illustrative embodiment of the present invention, the present invention can also be applied to a case where only one of the gate interconnection line and the data interconnection line is formed of triple layers.

A method for fabricating a TFT substrate according to the present invention can be easily applied to an array on color filter (AOC) in which a TFT array is formed on a color filter. As described above, by etching Mo/Cu/MoN multiple layers using an etchant according to an embodiment of the present invention, adhesion to a structure under the multiple layers is maintained and an interconnection line having a superior profile in which a Cu layer is not corroded can be obtained. Moreover, by fabricating a TFT substrate having Mo/Cu/MoN multiple layers using an etchant according to an embodiment of the present invention, adhesion of gate interconnection lines and data interconnection lines to a TFT substrate, and profiles of the gate interconnection lines and the data interconnection lines are improved. Also, reliability of the gate interconnection lines and the data interconnection lines is provided, thereby improving a signal characteristic and image quality.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method for fabricating an interconnection line, the method comprising:
    forming multiple layers including a buffer layer consisting of molybdenum (Mo), a copper (Cu) layer, and a corrosion prevention layer consisting of molybdenum nitride (MoN) on a substrate, wherein the Cu layer is interposed between the buffer layer and the corrosion prevention layer; and
    etching the multiple layers using an etchant consisting of 10-20 wt % hydrogen peroxide, 1-5 wt % organic acid, a 0.1-1 wt % triazole-based compound, a 0.01-0.5 wt % fluoride compound, and deionized water as the remainder.

2. The method of claim 1, wherein the organic acid is citric acid, the triazole-based compound is benzotriazole, and the fluoride compound is hydrofluoric acid.

3. The method of claim 1, wherein the substrate is an insulating substrate or a semiconductor substrate.

4. The method of claim 1, wherein the etching is performed at a temperature of 20-50° C.

5. The method of claim 1, wherein the etching is performed using spraying.

6. The method of claim 1, wherein the etching is performed for 50-120 seconds.

7. The method of claim 1, wherein the etching is performed on the buffer layer, the Cu layer, and the corrosion prevention layer forming the multiple layers in a batch manner.

8. The method of claim 1 wherein the buffer layer, Cu layer and corrosion prevention layer are sequentially deposited.

9. A method for fabricating a thin film transistor (TFT) substrate, the method comprising:
   forming a multi-layered gate line on a substrate and forming a gate interconnection line by etching the multi-layered gate line;
   forming a gate insulating layer and a semiconductor layer on the substrate and the gate interconnection line; and
   forming a multi-layered data line on the semiconductor layer and forming a data interconnection line by etching the multiple-layered data line, wherein the forming of the gate interconnection line and/or the data interconnection line comprises sequentially depositing a buffer layer consisting of molybdenum (Mo), a copper (Cu) layer, and a corrosion prevention layer consisting of molybdenum nitride (MoN) on the substrate, so that the Cu layer is interposed between the buffer layer and the corrosion prevention layer, and etching using an etchant consisting of 10-20 wt % hydrogen peroxide, 1-5 wt % organic acid, a 0.1-1 wt % triazole-based compound, a 0.01-0.5 wt % fluoride compound, and deionized water as the remainder.

10. The method of claim 9, wherein the organic acid is citric acid, the triazole-based compound is benzotriazole, and the fluoride compound is hydrofluoric acid.

11. The method of claim 9, wherein the etching is performed at a temperature of 20-50° C.

12. The method of claim 9, wherein the etching is performed using spraying.

13. The method of claim 9, wherein the etching is performed for 50-120 seconds.

14. The method of claim 9, wherein the etching is performed on the buffer layer, the Cu layer, and the corrosion prevention layer forming the multiple layers in a batch manner.

* * * * *